(12) United States Patent
Ramsay

(10) Patent No.: US 6,712,943 B2
(45) Date of Patent: Mar. 30, 2004

(54) METHODS FOR ANGLE LIMITING DEPOSITION MASK

(75) Inventor: Bruce Gordon Ramsay, Novato, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 10/011,508

(22) Filed: Nov. 6, 2001

(65) Prior Publication Data

US 2003/0087033 A1 May 8, 2003

(51) Int. Cl.[7] .................................................. C23C 14/00
(52) U.S. Cl. ...................................................... 204/192.1
(58) Field of Search ....................................... 204/192.1

(56) References Cited

U.S. PATENT DOCUMENTS

| | | | | |
|---|---|---|---|---|
| 4,273,812 A | * | 6/1981 | Tsutsui et al. | 427/248.1 |
| 4,816,287 A | * | 3/1989 | Young | 427/162 |
| 5,015,492 A | * | 5/1991 | Venkatesan et al. | 427/8 |
| 5,858,450 A | * | 1/1999 | Fujimura et al. | 427/9 |

* cited by examiner

Primary Examiner—Bret Chen
(74) Attorney, Agent, or Firm—Philip H. Von Neida

(57) ABSTRACT

A method for depositing a material onto a plurality of features located on a surface of a substrate provides more accurate and consistent control over where the material is deposited. The method comprises evaporating the material to create an evaporant stream, positioning the substrate so that the evaporant stream strikes the plurality of features over a range of exposure angles between the evaporant stream and the substrate, moving the substrate to vary the range of exposure angles over which the evaporant stream strikes the plurality of features, and moving one or more shutters into the evaporant stream to block any part of the evaporant stream that has an exposure angle greater than a critical exposure angle.

19 Claims, 13 Drawing Sheets

METHODS FOR ANGLE LIMITING DEPOSITION MASK

BACKGROUND

1. Field of the Invention

The invention relates generally to the field of deposition processes, and more particularly, to systems and methods for an angle limiting deposition mask.

2. Background Information

Many modern flat screen displays with large viewable areas are constructed using a variety of technologies. These include displays such as active-matrix liquid-crystal displays, ferroelectric displays, and electroluminescent displays. During the manufacturing process for these devices, large substrates have to be assembled for use as display screens. Each substrate has hundreds of thousands, often millions, of surface features that form elements such as the individual pixels of the display screen. These surface features have to be coated with different materials, such as metals or polymers, to form the fully functional pixels.

For example, the surface features on a substrate for an electroluminescent display have layers of electroluminescent phosphors coated on them. On conventional active matrix liquid crystal displays, thin films of amorphous or polycrystalline silicon must be deposited onto surface features present on a glass substrate. Active matrix displays are advantageous because they offer improved performance and reduced size (in terms of depth) for specialized applications in laptop computers and high-definition televisions.

A physical vapor deposition process can be used to apply layers of a coating material onto a substrate, and in particular onto the surface features of a substrate. During the physical vapor deposition process, the coating material being applied or a reactant material is evaporated, and the resulting evaporant stream is directed at the surface features of the substrate. The evaporant then deposits onto or reacts with the surface features of the substrate, thereby creating layers of the desired coating material on the surface features.

In some deposition process applications, it is desirable to have coating material deposit onto both a top surface and a side surface of each surface feature on a substrate. Coating material on the top surface of a surface feature can be used for different purposes, including but not limited to use as an electron barrier. Similarly, coating material on the side surface of a surface feature can also be used for a variety of purposes, including but not limited to use as a reflector and as an electron drain. To be useful as a reflector and as an electron drain, the coating material should cover substantially all of the side surface of the surface feature, and should be as close to the surface of the substrate as possible without contacting that surface. Unfortunately, it is not possible to conform to such parameters using known physical vapor deposition equipment and processing techniques. Therefore, tradeoffs must be made that result in the side surfaces not being covered in their entireties, and that create uneven coating material coverage from one side surface to the next.

Accordingly, improved physical vapor deposition techniques that can provide better control over where the coating is deposited are desirable. For example, in some instances the coating is intended to completely cover a side surface of a surface feature, while in other instances control is needed to limit deposition to a top surface of a surface feature, to partially coat a side surface of a surface feature, or even to partially coat a surface of the substrate.

SUMMARY

Some of the disadvantages and problems associated with known physical vapor deposition processes have been substantially reduced or eliminated using various embodiments of the present invention.

According to an embodiment of the invention, a method for depositing a material onto a plurality of features located on a surface of a substrate comprises evaporating the material to create an evaporant stream, positioning the substrate so that the evaporant stream strikes the plurality of features over a range of exposure angles between the evaporant stream and the substrate, moving the substrate to vary the range of exposure angles over which the evaporant stream strikes the plurality of features, and moving one or more shutters into the evaporant stream to block any part of the evaporant stream that has an exposure angle greater than a critical exposure angle.

According to another embodiment of the invention, a method for depositing a material onto a plurality of features located on a surface of a substrate comprises evaporating the material to create an evaporant stream, positioning the substrate within the evaporant stream, thereby depositing the material onto portions of the plurality of features, moving the substrate, thereby depositing the material onto further portions of the plurality of features, and moving one or more shutters into the evaporant stream to block any part of the evaporant stream that will contact the surface of the substrate.

According to yet another embodiment of the invention, a system for depositing a material onto a plurality of features located on a surface of a substrate comprises an evaporator configured to evaporate the material to create an evaporant stream, a movable mount configured to hold and move the substrate within the evaporant stream, and one or more shutters positioned to block at least a portion of the evaporant stream from striking the substrate.

An important technical advantage of the present invention includes using a moving shutter to reduce or prevent the deposition of coating material onto areas of a substrate that would be adversely affected by it. During the manufacture of large-screen flat panel televisions for example, this allows substrate elements to be substantially evenly coated with coating material while the surface of the substrate remains substantially free of coating material.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION

Embodiments of the present invention and their advantages are best understood by referring to FIGS. 1 through 5D of the drawings. Like numerals are used for like and corresponding parts of the various drawings.

Figure 1:
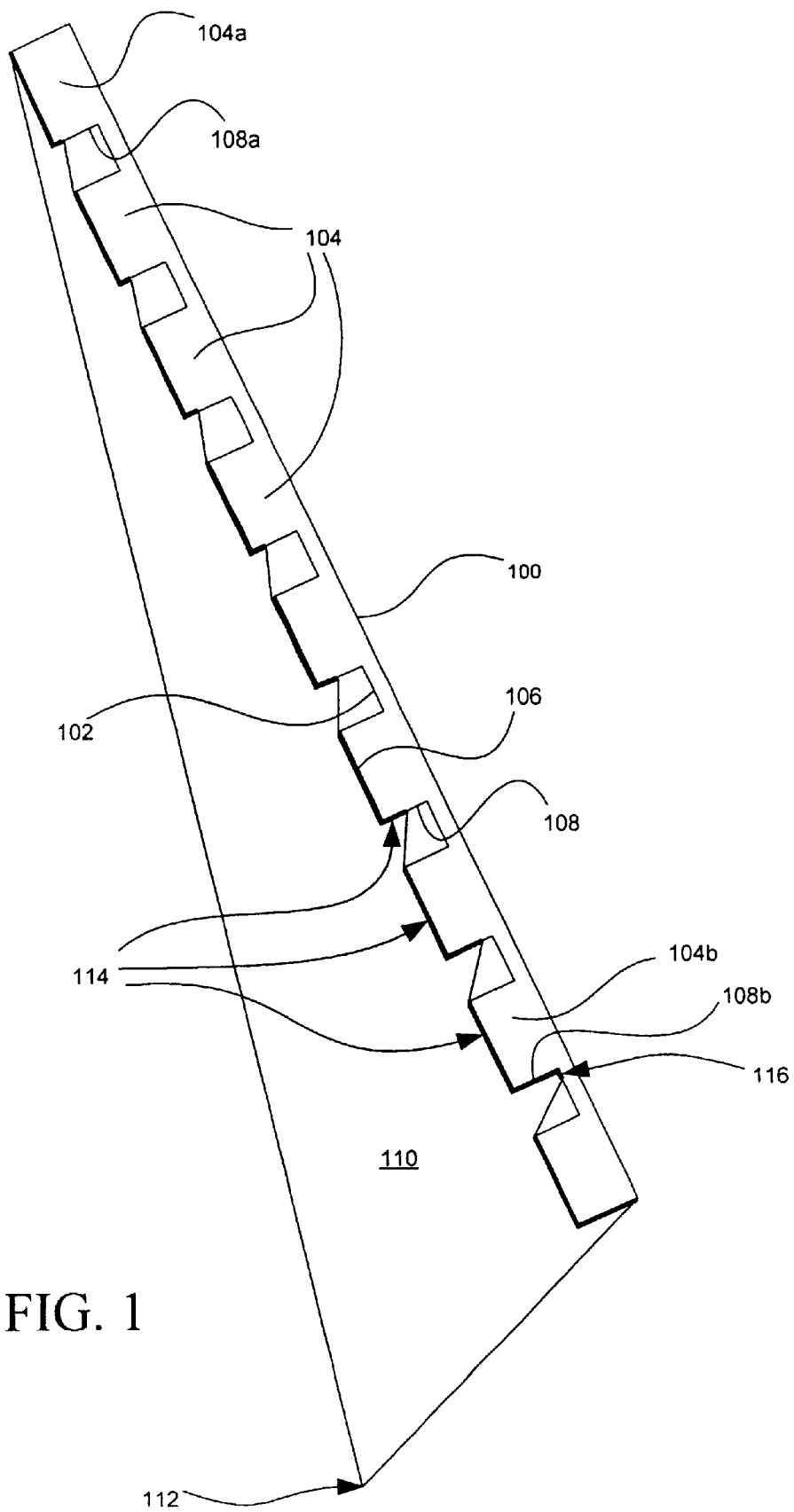
FIG. 1 illustrates a substrate being coated with deposition material during a physical vapor deposition process where the substrate is in close proximity to the source of the evaporant.

FIG. 1 illustrates a substrate 100 undergoing a deposition process using known methods. As used herein, the term "deposition process" generally refers to all variants of a deposition process, including but not limited to physical vapor deposition processes, vapor deposition processes, evaporation deposition processes, line of sight deposition processes, and reactive deposition processes. Reactive deposition processes can include introducing a gas, an ion source, or an additional deposition source near the primary source (co-evaporation).

The deposition process is used here to deposit one or more layers of a coating material onto substrate 100. Substrate 100 represents any of a number of different structures that can be subjected to a deposition process, and that can be used in a number of different applications. One example of such an application is using substrate 100 in display screens for flat panel television displays. In FIG. 1, substrate 100 includes a surface 102 that contains a plurality of surface features 104. Each surface feature 104 can take on a variety of shapes, and will generally have a top surface 106 that is substantially parallel to surface 102, and at least one side surface 108 that is generally perpendicular to surface 102. Surface features 104 can also be configured such that top surface 106 is not substantially parallel to surface 102 and/or side surface 108 is not substantially perpendicular to surface 102. For instance, surface features 104 can take on triangular shapes, trapezoidal shapes, or rounded or semi-circular shapes. Regardless of the shape used, it is upon these surface features 104, and in particular top and side surfaces 106 and 108, that the coating material is applied.

It should be noted that substrate 100 will typically contain hundreds or thousands of surface features 104. The use of only a small number of surface features 104 in FIG. 1 is for purposes of clarity and simplicity.

In some deposition processes, it is only desired to deposit coating material onto top surfaces 106. In other deposition processes, it is desired to deposit coating material onto both top surfaces 106 and side surfaces 108. In applications such as flat panel display screens, coating material located on top surfaces 106 can act as an electron barrier coating, while coating material located on side surfaces 108 can act as an electron drain and/or as a reflector. In processes where coating material is deposited onto side surfaces 108, it is generally desirable for the coating material to cover as much of the surface area of side surface 108 as possible, while not contacting or depositing onto surface 102. Allowing coating material to contact or deposit onto surface 102 often causes short circuits or blocking of the light emitting aperture, which can result in substrate 100 having to be discarded.

During the deposition process shown in FIG. 1, substrate 100 is placed in the path of an evaporant stream 110. Evaporant stream 110 consists of the coating material in gaseous form. This coating material can be a metal, an organic material (such as a polymer), or any other material that can be used in a deposition process. Alternatively, evaporant stream 110 can consist of a reactant material that reacts upon contact with the surfaces of surface features 104. In such case, the resulting reaction will generally produce the desired coating material. As shown in FIG. 1, during a deposition process, substrate 100 is generally mounted such that surface 102 and surface features 104 are facing a source 112 of evaporant stream 110.

The material in evaporant stream 110 originates at source 112. It should be noted that source 112 can also comprise two or more separate sources. Source 112 typically consists of the coating material or reactant material in a solid or liquid state, and is located below substrate 100. The solid or liquid material that source 112 consists of is heated to form evaporant stream 110. Heat can be applied in a number of different ways, and one common method for heating source 112 is to direct an electron beam to impinge upon its surface. As source 112 is heated, the coating material vaporizes into a gaseous form, thereby generating evaporant stream 110. Evaporant stream 110 then rises up and contacts surface features 104 of substrate 100. It should be noted that evaporant stream 110 is generally hemispherical in shape. For purposes of clarity, FIGS. 1 through 5 illustrate only the segment of evaporant stream 110 that contacts substrate 100.

When evaporant stream 110 contacts substrate 100, coating material deposits onto surface features 104 to create coating layers 114. As shown in FIG. 1, substrate 100 can be oriented to permit coating layers 114 to cover all or a portion of each top surface 106 of surface features 104. Unfortunately, there is no orientation in which substrate 100 can be positioned to allow coating material to evenly deposit onto all of side surfaces 108, regardless of whether side surfaces 108 are being covered in their entireties or only partially. Furthermore, surface 102 may be covered with coating layers 114 although in some applications that may not be desirable.

FIG. 1 clearly shows this inability to deposit coating material onto the entirety of each side surface 108 without also depositing coating material onto surface 102. Here, the orientation of substrate 100 allows evaporant stream 110 to reach every one of side surfaces 108, however, coating layers 114 are created unevenly from one side surface 108 to the next. The unevenness of coating layers 114 can be seen, for instance, by comparing surface feature 104a with surface feature 104b. Surface feature 104a has a side surface 108a that is only slightly covered by coating layer 114, while surface feature 104b has a side surface 108b that is entirely covered by deposition material layer 114.

As shown in FIG. 1, although many side surfaces 108 have only been partially covered by coating material, one coating layer 114 is already covering a portion of surface 102 at location 116. Reorienting substrate 100 so that evaporant stream 110 does not contact surface 102 would result in even less exposure of side surfaces 108 to evaporant stream 110. Further, reorienting substrate 100 to allow more exposure of side surfaces 108 to evaporant stream 110 would expose more of surface 102 to evaporant stream 110. Accordingly, this known method for depositing coating material onto surface features 104 of substrate 100 suffers from severe limitations.

Figure 2:
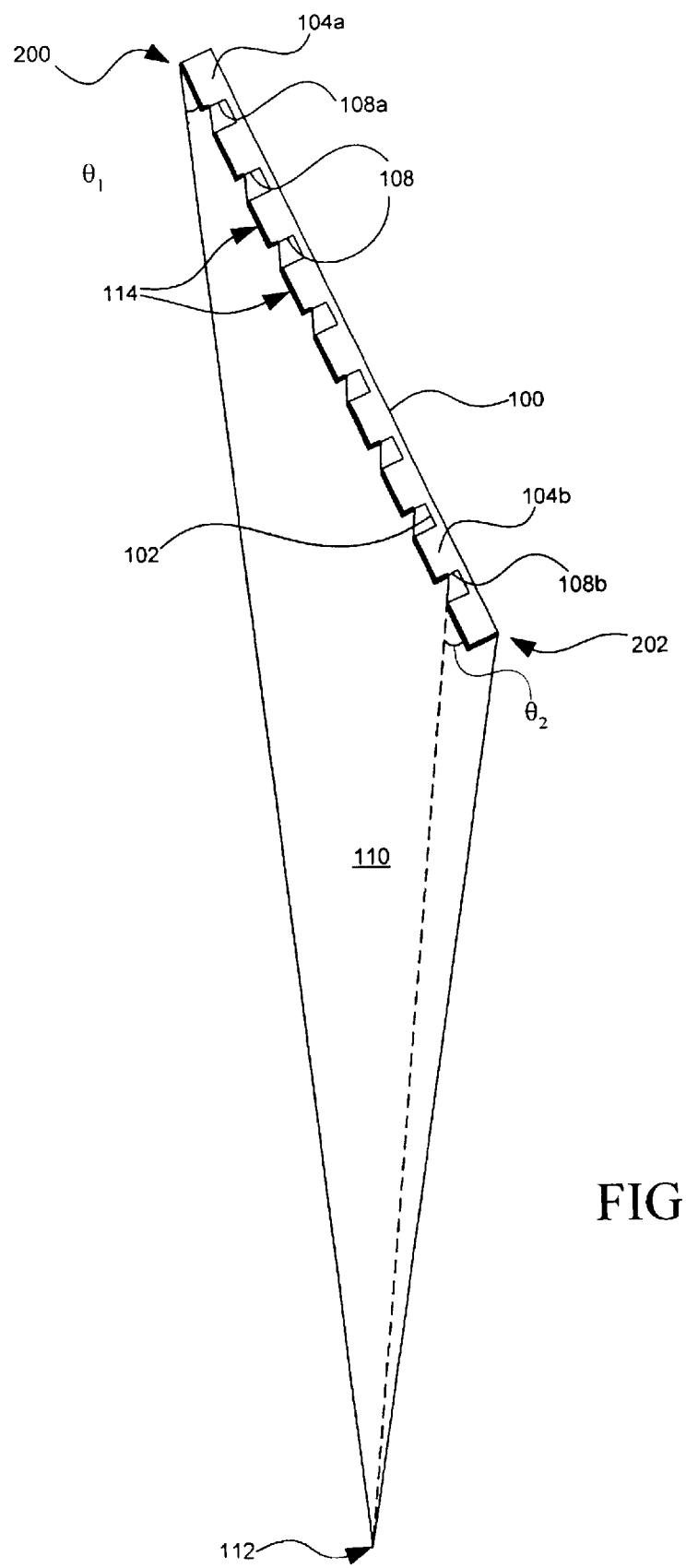
FIG. 2 illustrates a substrate being coated with deposition material during a physical vapor deposition process where the substrate is relatively far from the source of the evaporant.

FIG. 2 illustrates another method for depositing coating material onto surface features 104 of substrate 100. Here, substrate 100 is moved further away from source 112 to narrow the range of exposure angles for substrate 100. Exposure angles are the angles at which evaporant stream 110 strikes substrate 100, as measured between substrate 100 and evaporant stream 110, at different locations along substrate 100. There is a distribution of exposure angles across the surface of substrate 100. For instance, the exposure angle $\theta_1$ at a top end 200 of substrate 100 in FIG. 2 is approximately eighteen degrees, while the exposure angle $\theta_2$ at a bottom end 202 of substrate 100 is approximately thirty-three degrees. So the range of exposure angles here in FIG. 2 is around fifteen degrees. If substrate 100 is maintained in a constant orientation, even further distances between substrate 100 and source 112 will yield even narrower ranges of exposure angles. Compare this to FIG. 1 where the range of exposure angles is around eighty degrees.

The narrower range of exposure angles provides better control over where coating material is deposited and allows for a more even deposition of coating material onto side surfaces 108. Here, coating layers 114 still cover the entirety of each top surface 106 of surface features 104 and more evenly cover portions of each side surface 108. In addition, substrate 100 can be oriented so that no material is deposited onto surface 102.

Unfortunately, this method suffers from limitations as well. One major limitation concerns the cost of this method. Because substrate 100 can be very large, especially when substrate 100 is being manufactured for use in large, flat panel displays, the distance necessary between substrate 100 and source 112 to evenly deposit material onto side surfaces 108 can be relatively great. For instance, the distance can reach over ninety inches. This can add millions of dollars to the cost of the deposition processing equipment, often making it cost prohibitive to build such process equipment.

Another limitation of this method is that the large distances required between substrate 100 and source 112 result in the waste of a great amount of coating material. The dispersion of coating material in the form of evaporant stream 110 is hemispherical in shape, therefore, as substrate 100 is moved away from source 112, it will be exposed to a smaller percentage of evaporant stream 110. The large portion of evaporant stream 110 that does not contact substrate 100 is then lost.

For these reasons, tradeoffs are generally made that result in substrate 100 being kept at a distance from source 112 that is not far enough to be cost prohibitive, but that result in an uneven, yet tolerable, deposition of coating material onto side surfaces 108. As shown in FIG. 2, side surface 108a of surface feature 104a has less coating material deposited onto it than side surface 108b of surface feature 104b. The disparity, however, is not as severe as that shown in FIG. 1, so the differences may be within a range that is acceptable.

Another limitation on the method shown in FIG. 2 is that side surfaces 108 are still not coated in their entirety. This is because any attempt to coat side surface 108a in its entirety will generally result in coating layers 114 being deposited onto surface 102. Accordingly, only some side surfaces 108 can be coated in their entireties.

Figure 3A:
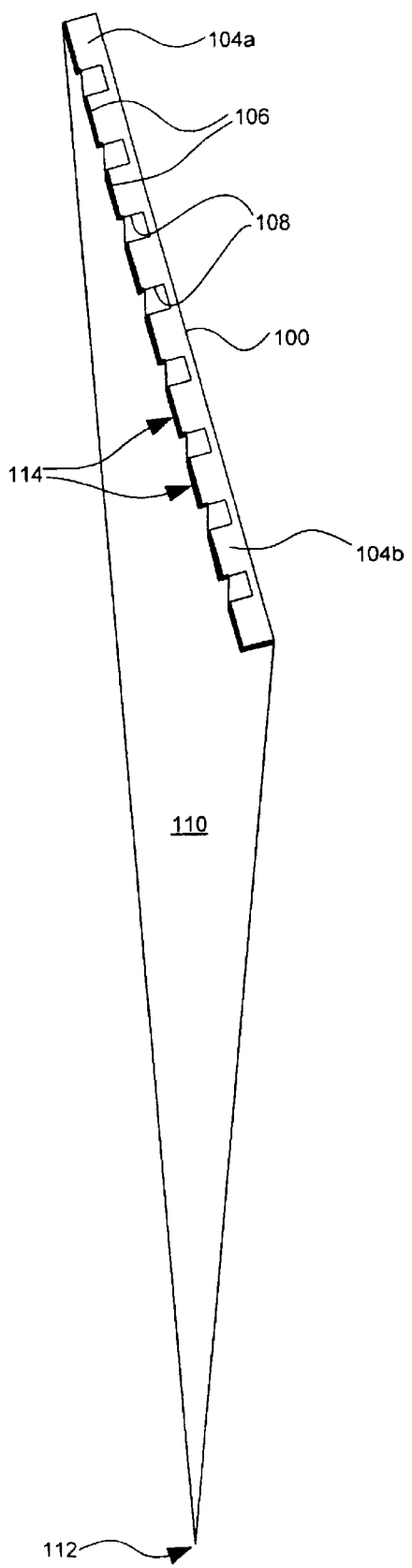
FIGS. 3A to 3C illustrate three moments during a physical vapor deposition process where a substrate is rotated through an evaporant stream as it is being coated with a deposition material.
Figure 3B:
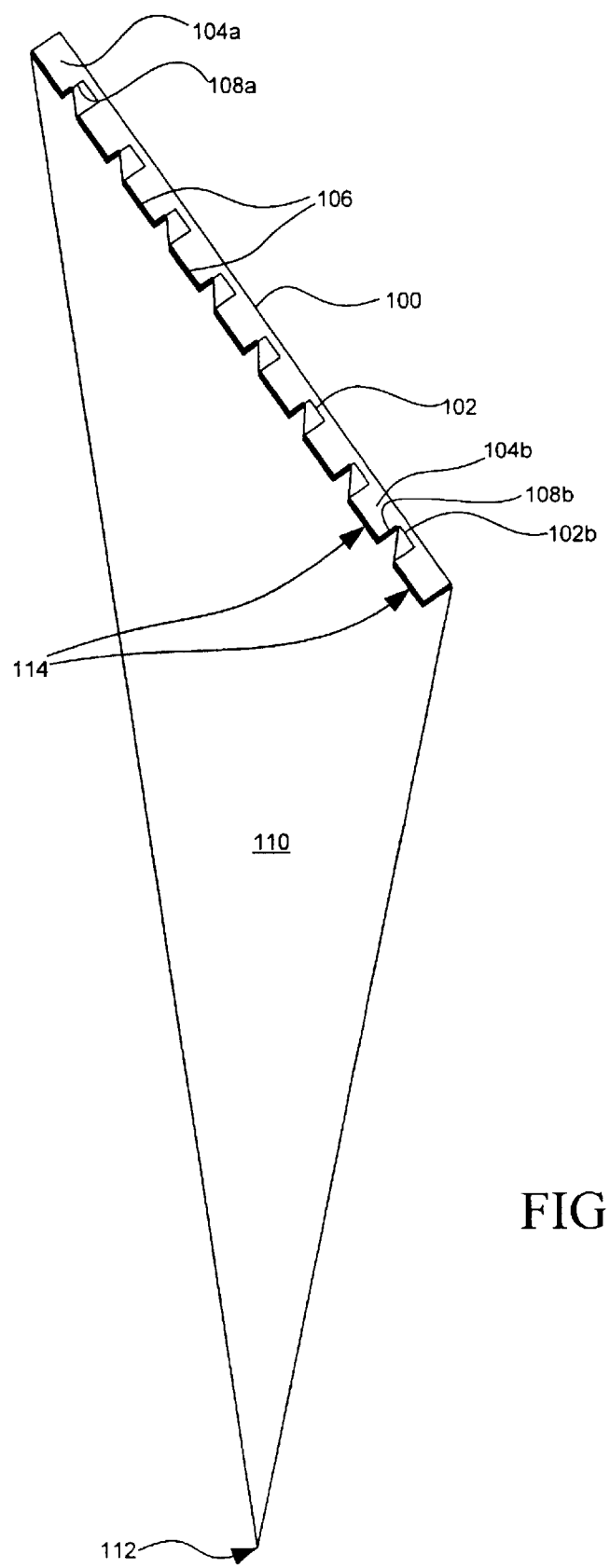
Figure 3C:
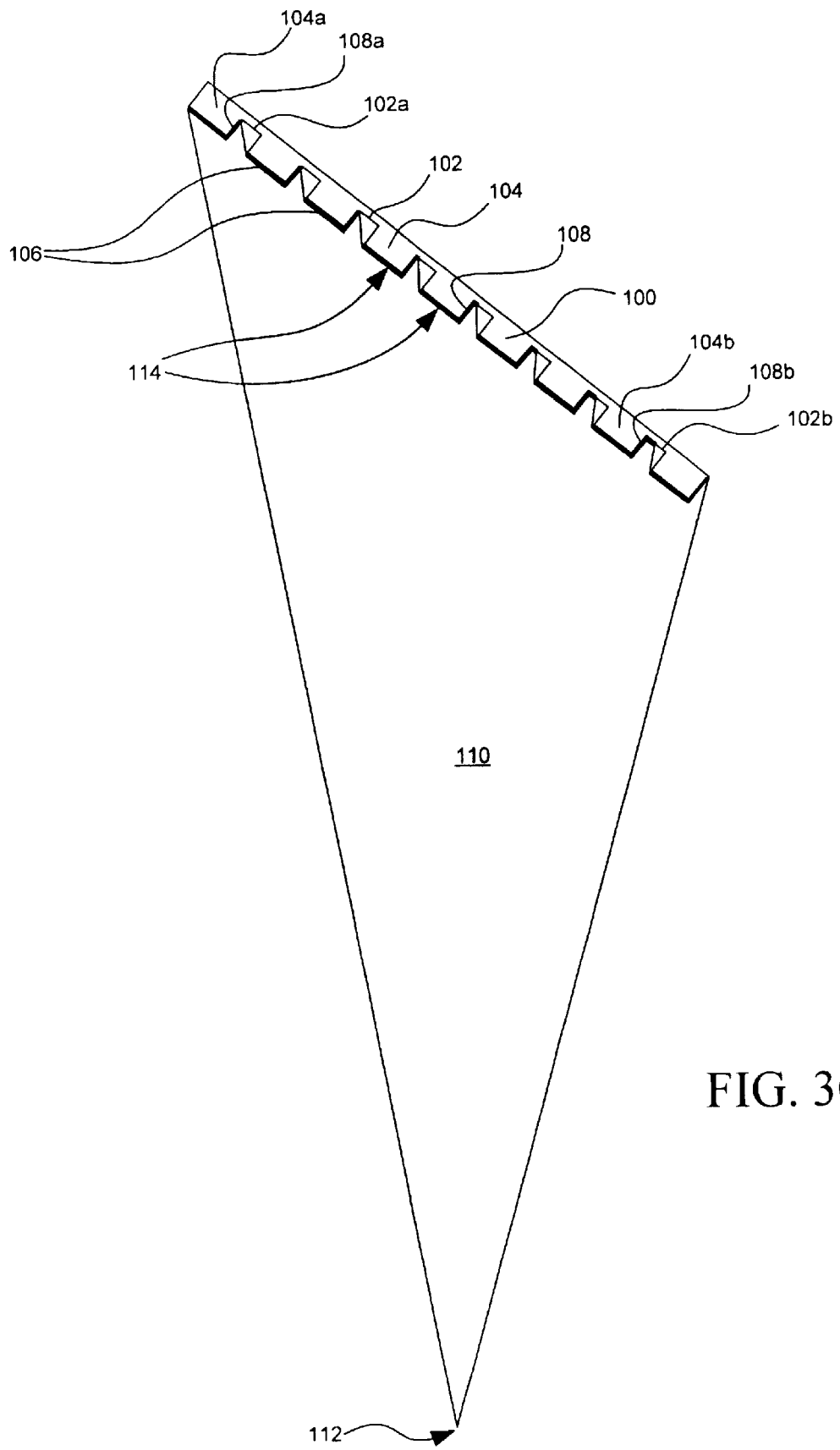

FIGS. 3A to 3C are illustrations demonstrating a deposition process where substrate 100 is moved, and in particular rotated, through evaporant stream 110 to allow coating layers 114 to deposit onto side surfaces 108. It should be noted that the order shown in FIGS. 3A to 3C is solely for illustrative purposes and the deposition process can also be carried out beginning at another point, for instance, the process can begin at the orientation shown in FIG. 3C and then proceed to FIG. 3A.

The movement of substrate 100 can be done relative to an axis of rotation located somewhere on substrate 100 itself, such as through its center. Alternately, the movement can be done relative to an axis of rotation located through the actual equipment that is holding and moving substrate 100. In this process, the axis of rotation will generally be parallel to the ground.

This process of rotating substrate 100 through evaporant stream 110 allows top surfaces 106 to receive thicker coating layers 114 because they can be exposed to evaporant stream 110 for longer periods of time. For instance, substrate 100 can initially be oriented so that evaporant stream 110 does not contact side surfaces 108. This provides time for evaporant stream 110 to deposit coating material onto top surfaces 106 and build up coating layers 114. For example, coating layers 114 on top surfaces 106 that are used as electron barriers are generally required to be 1000–3000 Angstroms in thickness. Then substrate 100 can be rotated to expose side surfaces 108 to evaporant stream 110 as well. Coating layers 114 on side surfaces 108 do not need to be as thick, and are generally 200–1000 Angstroms.

FIG. 3A is an illustration of one moment during the rotation of substrate 100 through evaporant stream 110. This moment can represent the orientation that substrate 100 is in when the deposition process begins, or it can be a moment after the rotation of substrate 100 has begun. In FIG. 3A, substrate 100 is positioned at an orientation that exposes substrate 100 to a very narrow range of exposure angles. For instance, the exposure angle at surface feature 104b is only slightly larger than the exposure angle at surface feature 104a. In particular, the exposure angle at surface feature 104b is approximately seventeen degrees in FIG. 3A, while the exposure angle at surface feature 104a is approximately ten degrees. Therefore, the range of exposure angles is around seven degrees. It should be noted that the exposure angles provided here are simply illustrations, and are not intended to be construed as limitations on the invention.

In FIG. 3A, with this narrow a range of exposure angles, evaporant stream 110 has limited penetration between surface features 104 to reach side surfaces 108. Thus, side surfaces 108 only have small portions of their surface areas exposed to evaporant stream 110 to form coating layers 114. This allows coating layers 114 to build up on top surfaces 106.

FIG. 3B is an illustration of a second moment during the rotation of substrate 100 through evaporant stream 110. Here, substrate 100 has been moved to an orientation where the range of exposure angles over which evaporant stream 110 strikes substrate 100 is wider than the range in FIG. 3A. Accordingly, the exposure angle at surface feature 104b is much larger than the exposure angle at surface feature 104a. In particular, the exposure angle at surface feature 104b is approximately forty-three degrees in FIG. 3B, while the exposure angle at surface feature 104a is approximately twenty-seven degrees. Again, these angles are provided here solely for illustrative purposes and are not to be construed as limitations on the invention.

As shown in FIG. 3B, side surface 108b is coated in its entirety by coating layer 114. In addition, there is no coating material on adjacent surface 102b. This is the ideal result for side surface 108b in this embodiment. The exposure angle of side surface 108b at this moment is herein referred to as the critical exposure angle. The critical exposure angle represents the angle at which the desired level of coating has been applied to a surface. In this instance, the critical exposure angle occurs when side surface 108 is coated in its entirety by coating layer 114, while adjacent surface 102 does not come into contact with coating layer 114. Therefore, when any side surface 108 is at an exposure angle less than its critical exposure angle, it will not be covered in its entirety by coating layer 114. Further, when any side surface 108 is at an exposure angle greater than its critical exposure angle, coating layer 114 will contact or cover at least a portion of surface 102 adjacent to that particular side surface 108.

The critical exposure angle can be defined such that a specific portion of a surface is covered, the surface generally being either top surface 106, side surface 108, or surface 102. Each of top surface 106, side surface 108, and surface 102 can be covered partially or in its entirety. For instance, in the embodiment of FIGS. 3A to 3C, it is desired that side surfaces 108 be covered in their entireties. In other embodiments, surface 102, top surface 106, and side surface 108 may be covered partially or totally. So the value of the critical exposure angle will depend upon where coating layer 114 is desired.

Furthermore, the critical exposure angle generally varies from substrate to substrate, and even from surface feature to surface feature, as the height of surface features 104, the distance between surface features 104, the distance between substrate 100 and source 112, the angle at which different portions of substrate 100 are exposed to source 112, as well as other factors, will also play parts in establishing the critical exposure angle at any given point along substrate 100.

Unfortunately, in FIG. 3B side surface 108b is the only side surface 108 that is at the critical exposure angle, and therefore it is the only side surface 108 that is covered in its entirety by coating layer 114. The remaining side surfaces 108 still have portions of their surface areas that require further deposition of coating material. For instance, side surface 108a is not even half covered by coating layer 114.

FIG. 3C is an illustration of yet another moment during the rotation of substrate 100 through evaporant stream 110. FIG. 3C shows what happens when substrate 100 has been rotated to a point where side surface 104a has finally reached the critical exposure angle. As shown in FIG. 3C, side surface 104a is covered in its entirety by coating layer 114 without any coating material contacting the adjacent side surface 102a. However, because all of the other side surfaces 108 have now been rotated past the critical exposure angle, coating layers 114 are contacting or covering portions of surface 102 adjacent to these other side surfaces 108. For instance, surface 102b adjacent to side surface 108b is approximately half-covered by coating layer 114. Again, this deposition of coating material onto surface 102, especially at this many locations, is generally unacceptable.

Accordingly, deposition processes generally must be halted at a point where substrate 100 has not been rotated far enough for any side surface 108 to exceed the critical exposure angle. This results in a limited number of side surfaces 108 having the entirety of their surface areas coated with coating layers 114.

FIGS. 4A to 4D illustrate a physical vapor deposition method in accordance with an embodiment of the invention where an exposure angle limiting shutter 400 is used. Here, as substrate 100 is moved or rotated through evaporant stream 110, shutter 400 moves or rotates into evaporant stream 110 between source 112 and substrate 100 to shield portions of substrate 100 from further exposure to evaporant stream 110 as those portions reach the critical exposure angle.

More specifically, as each side surface 108 reaches the critical exposure angle, shutter 400 moves in and shields that particular side surface 108 from further exposure to evaporant stream 110. So any remaining side surfaces 108 that have not reached the critical exposure angle continue to be exposed to evaporant stream 110, while any side surfaces 108 that have moved past the critical exposure angle are blocked from further exposure by shutter 400. Then as substrate 100 continues to rotate and further side surfaces 108 reach the critical exposure angle, shutter 400 continues to move in and block more of evaporant stream 110. The use of shutter 400 thus enables every single side surface 108 on substrate 100 to be exposed to evaporant stream 110 at the critical exposure angle, without depositing coating material onto any portions of surface 102.

Figure 4A:
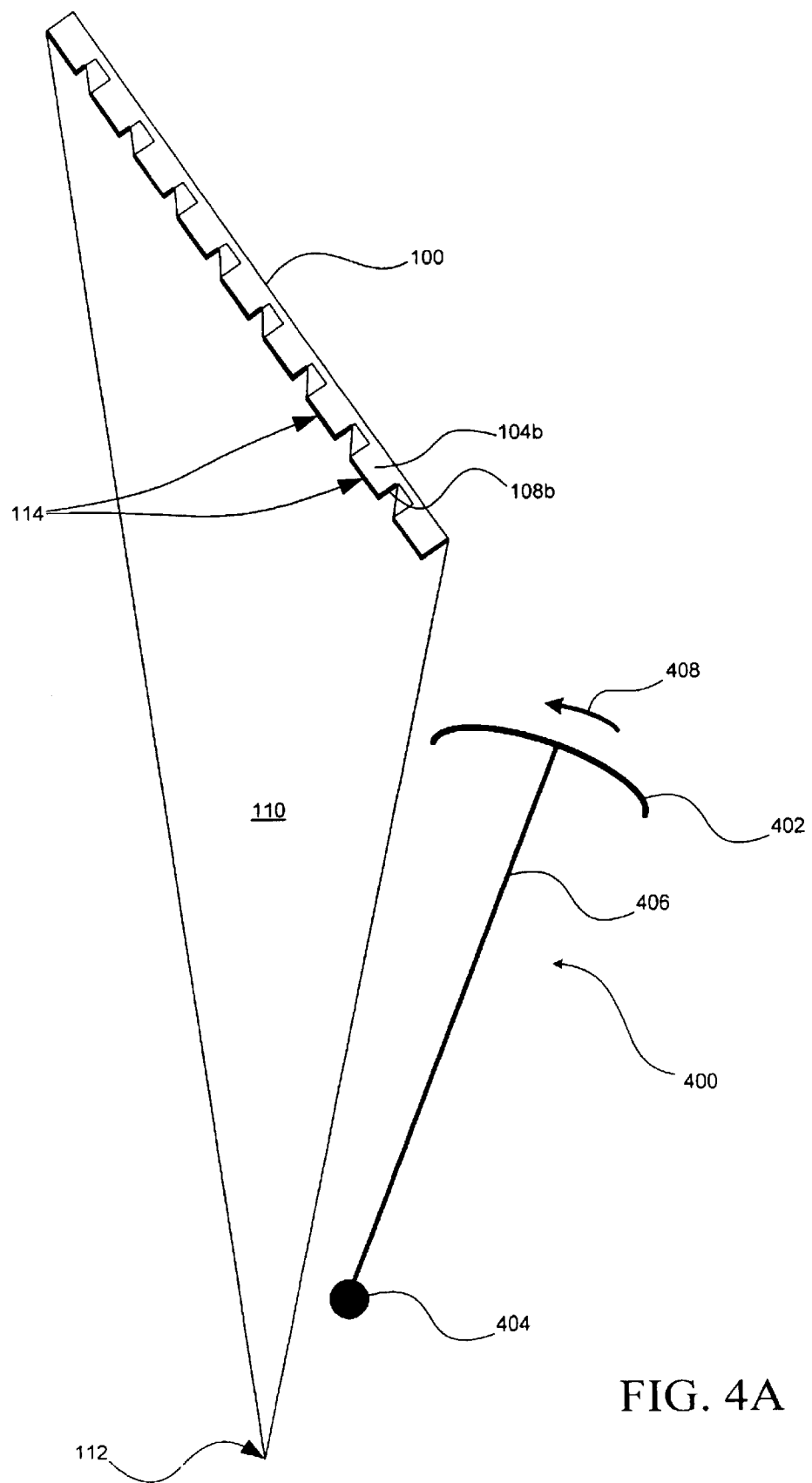
FIGS. 4A to 4D illustrate four moments during a physical vapor deposition process in which a shutter is used during the physical vapor deposition process in accordance with an embodiment of the invention.

FIG. 4A is an illustration of one moment from the beginning of the deposition process using exposure angle limiting shutter 400. It should again be noted that the order shown in FIGS. 4A to 4D is solely for illustrative purposes and the deposition process can also be carried out beginning at another point, for instance, beginning at the orientation shown in FIG. 4D and then proceeding to FIG. 4A.

Shutter 400 is mounted at a location where it can move into the path of evaporant stream 110 and effectively block evaporant stream 110 from contacting substrate 100. In FIG. 4A, shutter 400 comprises a shutter surface 402 that is connected to a pivot point 404 by a linkage 406. Pivot point 404 is the point of rotation for shutter 400. In FIG. 4A, shutter 400 can rotate into the path of evaporant stream 110, as shown by arrow 408. Also in FIG. 4A, substrate 100 is shown at an orientation that exposes side surface 108b to the critical exposure angle. As substrate 100 rotates into this orientation, shutter 400 moves into the path of evaporant stream 110 to start shielding side surface 108b before it exceeds the critical exposure angle.

Figure 4B:
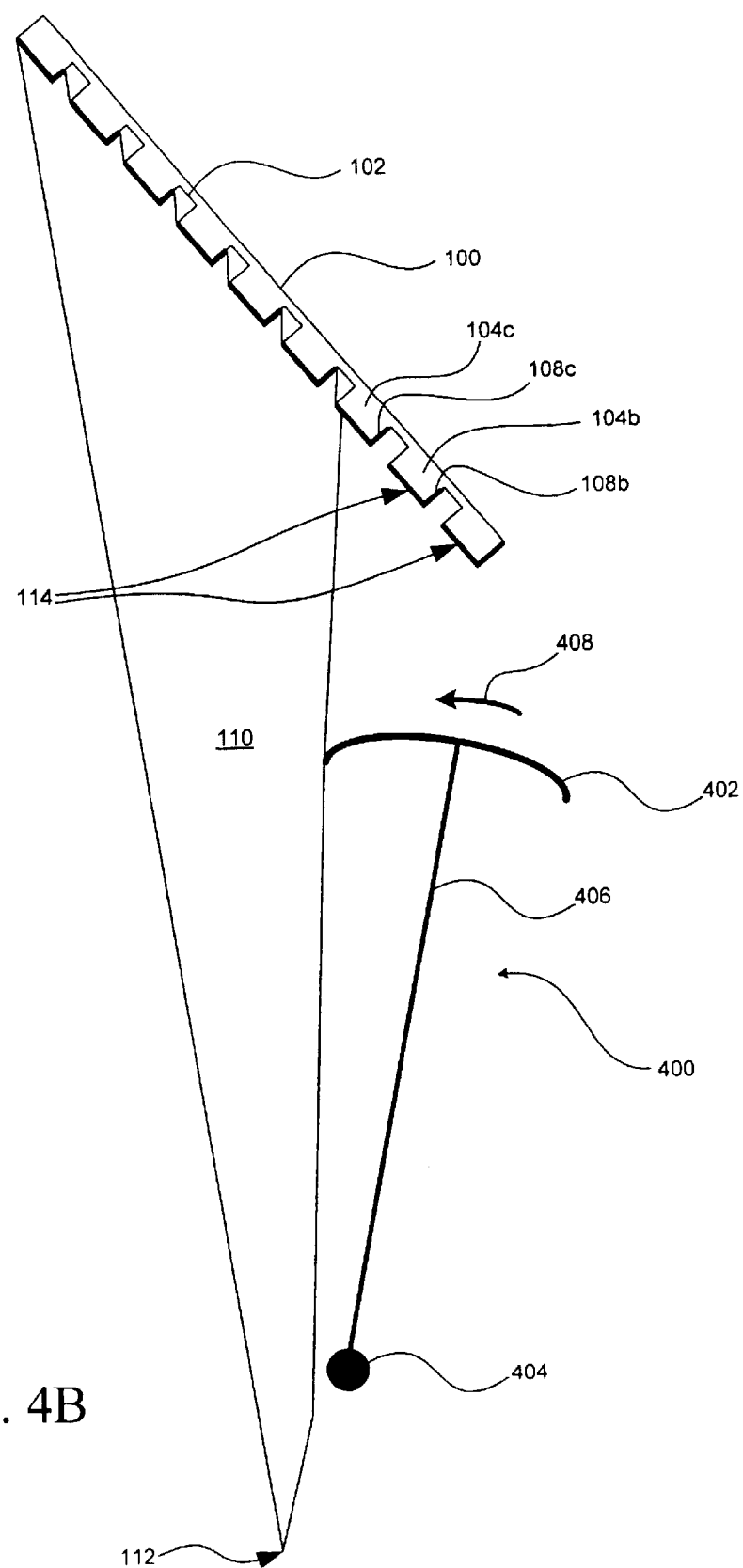

FIG. 4B is a second illustration of the deposition process using shutter 400. Here, substrate 100 has rotated to an orientation where two of side surfaces 108b and 108c have exceeded the critical exposure angle. Accordingly, shutter 400 shields these two side surfaces 108b and 108c from further exposure to evaporant stream 110. Shutter 400 does not, however, shield any other portions of substrate 100 from evaporant stream 110 as these other portions have not reached the critical exposure angle. It should be noted that in FIG. 4B, side surfaces 108b and 108c are substantially coated in their entireties with coating layers 114, and no coating material has reached surface 102.

Figure 4C:
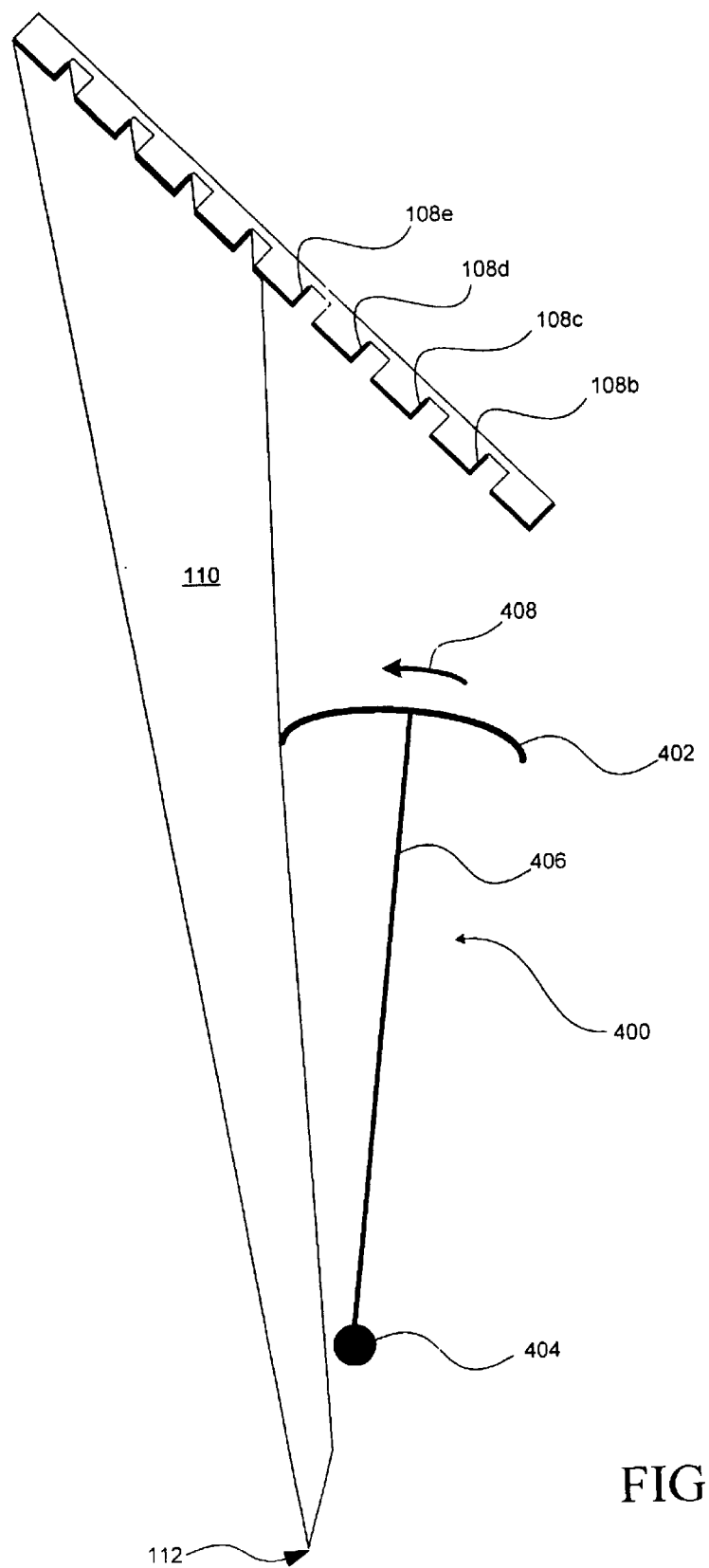
Figure 4D:
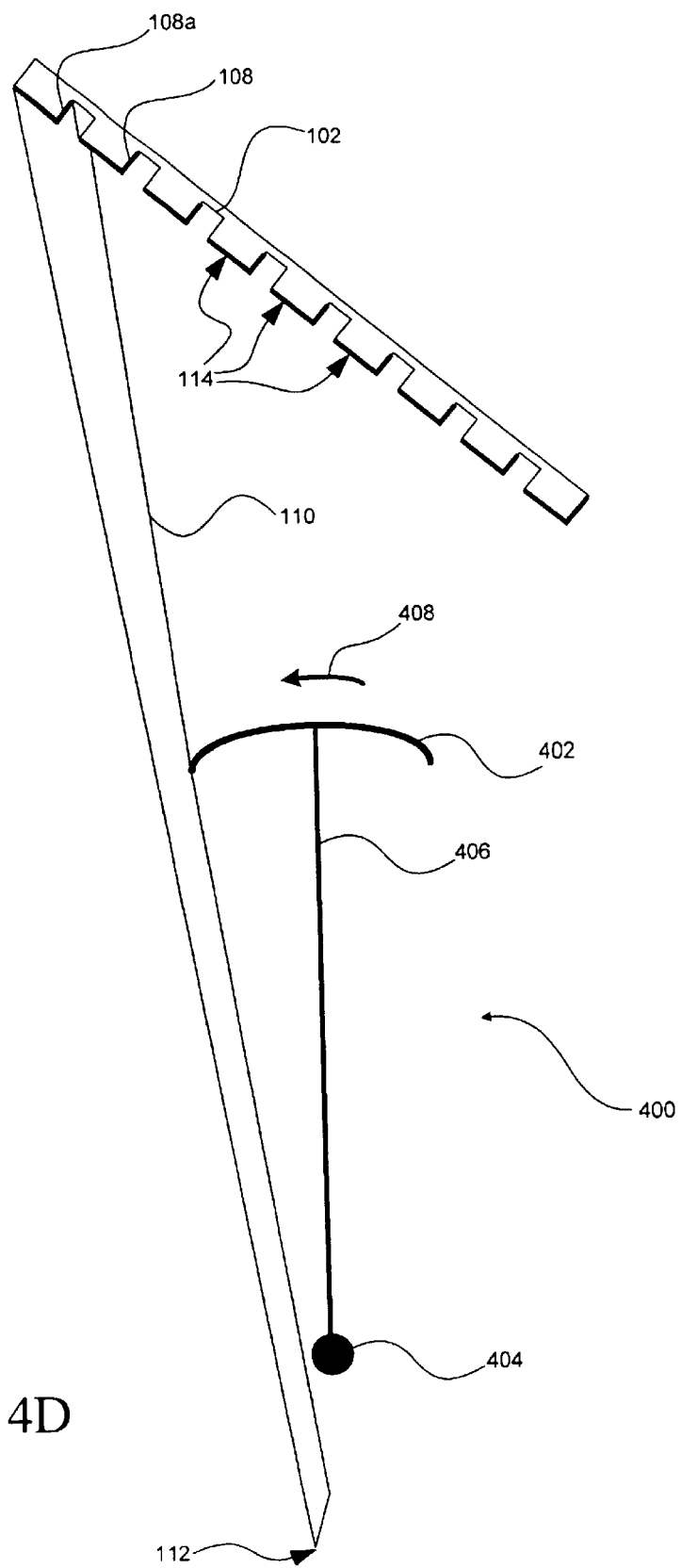
Figure 5A:
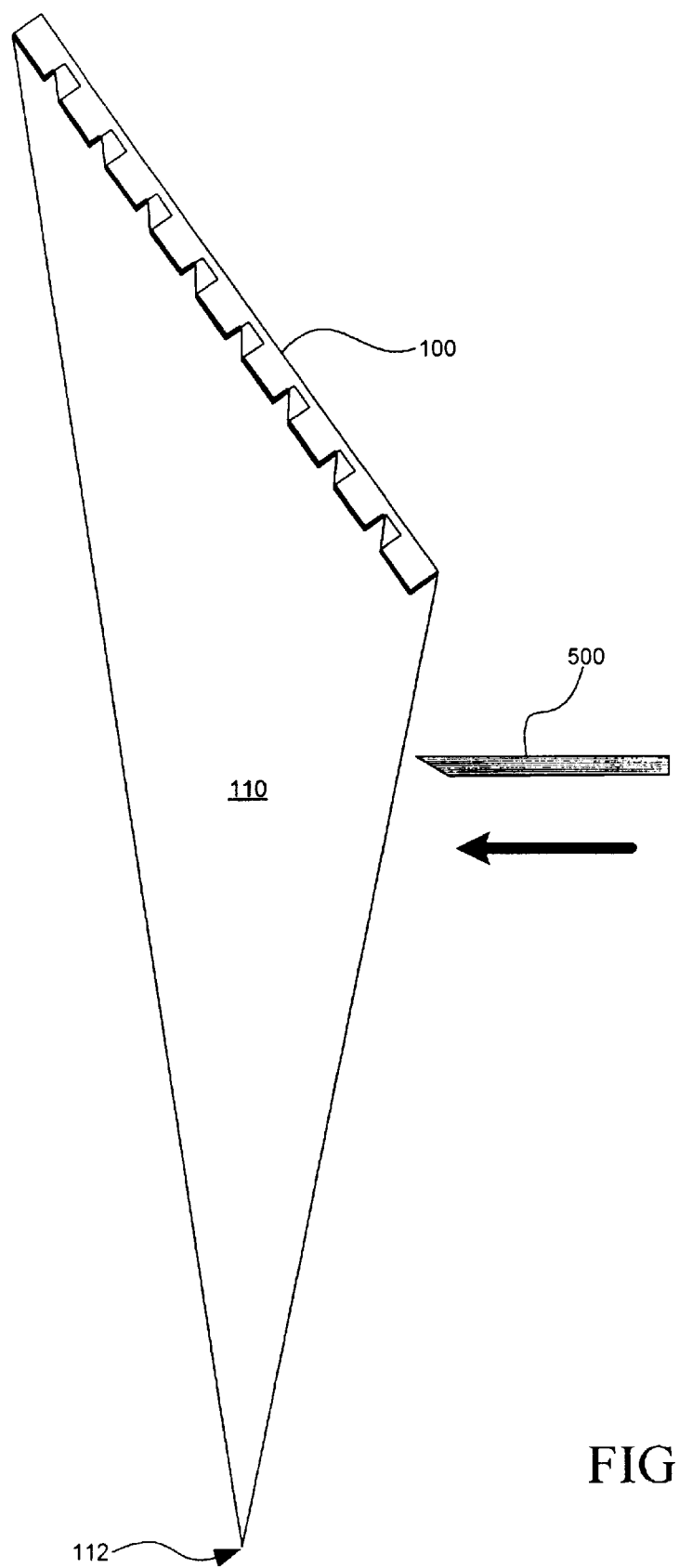
FIGS. 5A to 5D illustrate four moments during a physical vapor deposition process in which an alternative shutter is used during the physical vapor deposition process in accordance with another embodiment of the invention.
Figure 5B:
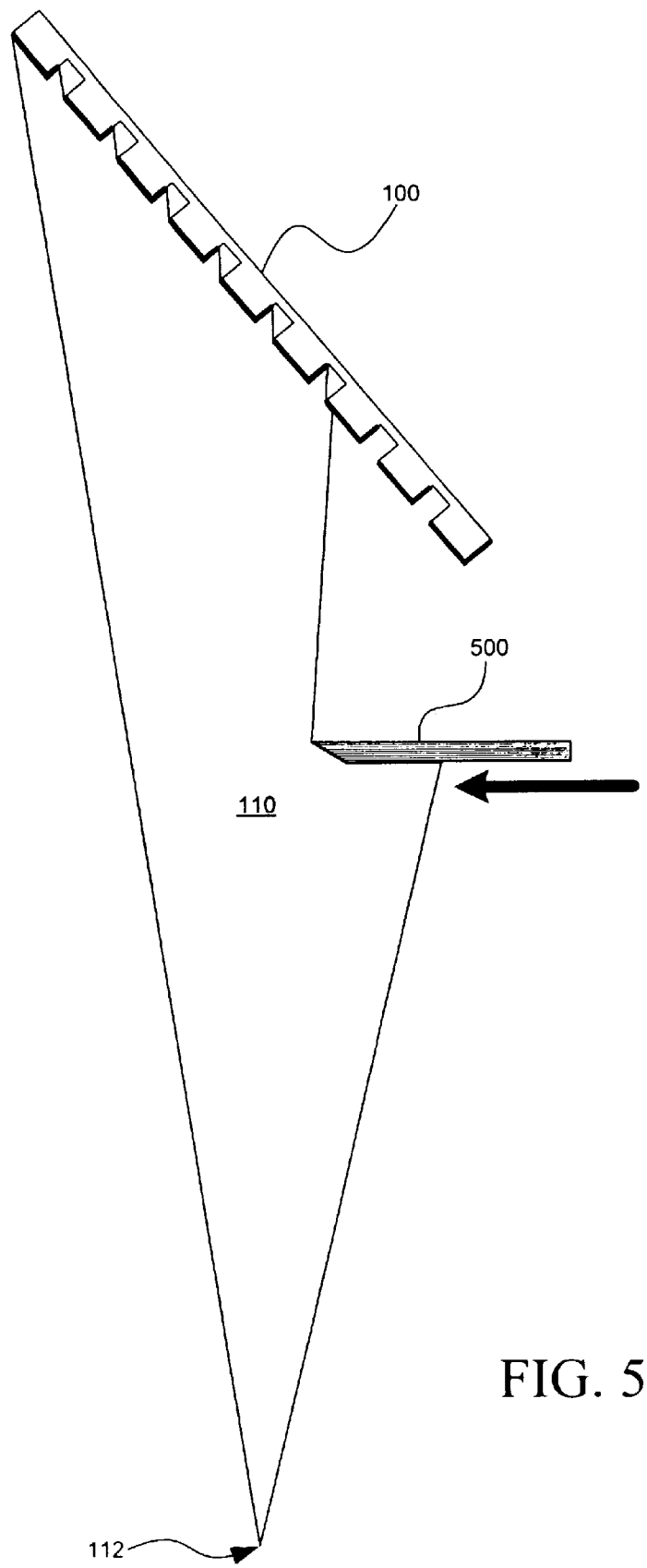
Figure 5C:
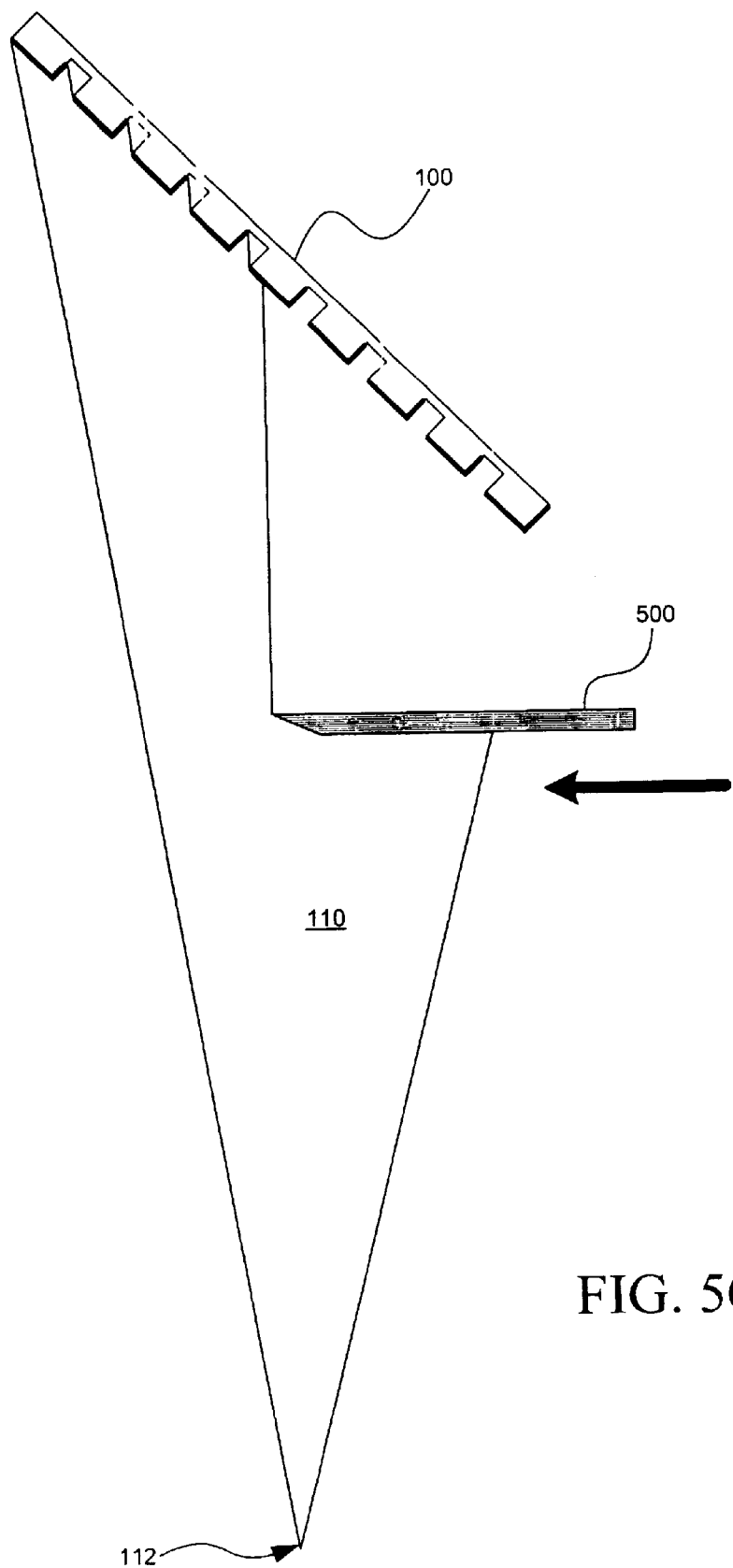
Figure 5D:
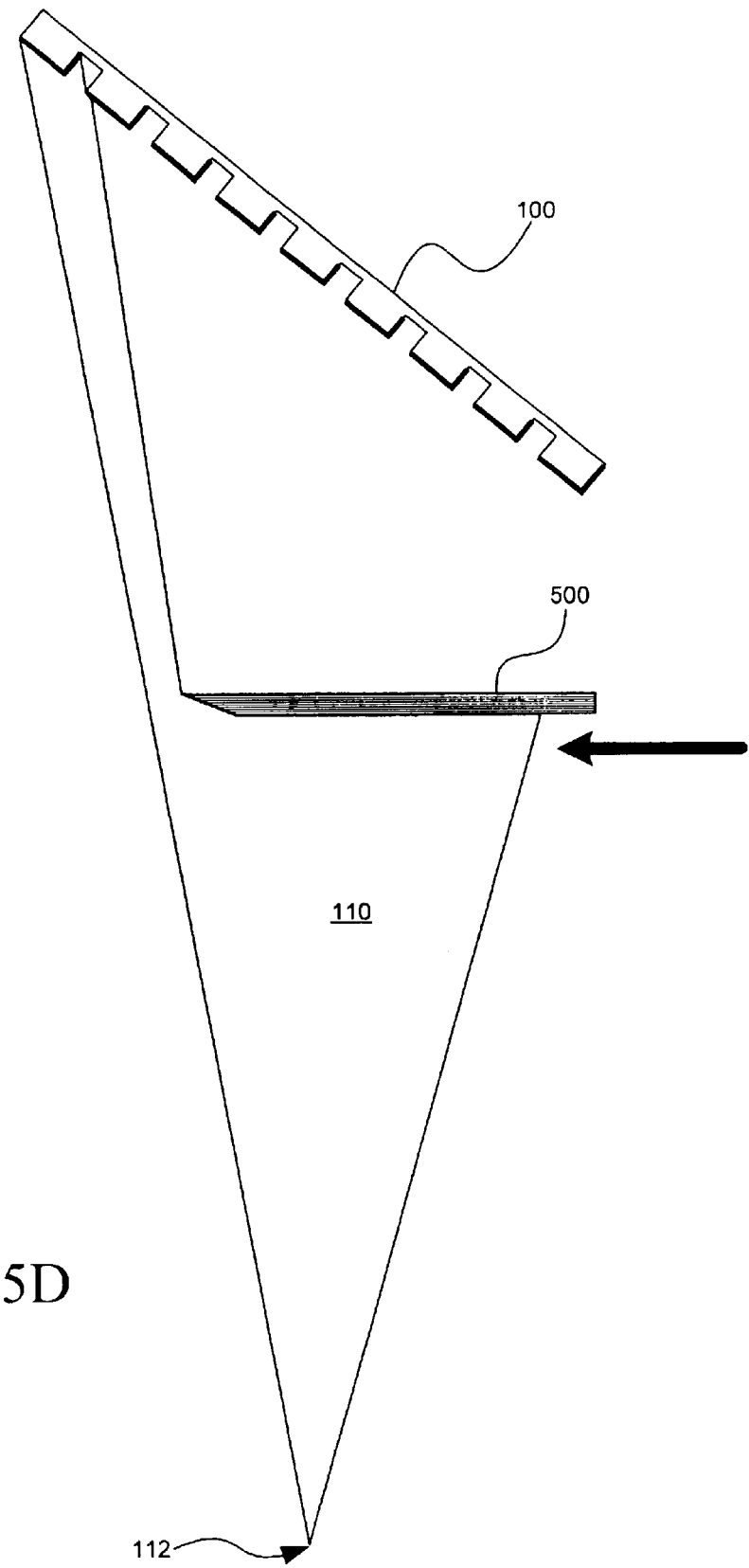

FIGS. 4C and 4D are two more illustrations of the deposition process using shutter 400. Here, two further orientations of substrate 100 are shown where more side surfaces 108 have been exposed to the critical exposure angle. In FIG. 4C for instance, side surfaces 108b through 108e have reached the critical exposure angle, and each of these side surfaces 108b through 108e is now blocked from further exposure to evaporant stream 110 by shutter 400. And in FIG. 4D, all side surfaces 108 except side surface 108a has been exposed to the critical exposure angle. Accordingly, shutter 400 blocks evaporant stream 110 from reaching all side surfaces 108 except side surface 108a. Once side surface 108a reaches the critical exposure angle and is therefore coated in its entirety, shutter 400 can shield side surface 108a from further exposure to evaporant stream 110 and the deposition process can end. Once again, it should be noted that in FIG. 4D, use of shutter 400 results in all side surfaces 108 being substantially coated in their entireties by coating layers 114, and no coating material reaches surface 102.

The relative motion between substrate 100 and shutter 400 can vary depending on many factors, including but not limited to the size of substrate 100, the distance between substrate 100 and source 112, the height of surface features 104, and the shape and density of evaporant stream 110. Thus, in some applications substrate 100 and shutter 400 can move at a constant speed relative to one another, and in other applications the relative speed between these two structures can increase, decrease, or fluctuate during the deposition process. Alternatively, substrate 100 and shutter 400 can move sequentially, with each element moving in turn as the process is carried out. The overall deposition time is determined by a number of factors including the minimum required thickness, deposition rate, incident angle, and time exposed to evaporant stream 110. Typically, substrate 100 moves as fast as possible consistent with required thickness. The position of shutter 400 is a function of the position of substrate 100 determined by the maximum allowable deposition angle.

FIGS. 5A to 5D illustrate an alternate embodiment of shutter 400 used during a deposition process. Again, the order shown in FIGS. 5A to 5D is solely for illustrative purposes and the deposition process can also be carried out beginning at another point, such as beginning at the orientation shown in FIG. 5D and then proceeding to FIG. 5A. Here, a flat panel shutter 500 is moved into evaporant stream 110 to shield substrate 100. Flat panel shutter 500 moves in a substantially linear path that runs parallel to the ground, as opposed to the rotating motion of shutter 400. The results, however, are the same as shown in FIGS. 4A to 4D. The primary difference between rotating shutter 400 and horizontally moving shutter 500 is that the rotating motion of shutter 400 may be easier to implement in some vacuum installations.

Accordingly, systems and methods of the invention have been described for an exposure angle limiting shutter. Unlike previously developed techniques in deposition processes do not evenly cover the side surfaces of surface features with coating material, do not substantially cover the side surfaces in their entireties, and that result in the surface of the substrate being susceptible to the deposition of coating material when not desired, the systems and methods of the present invention utilize a moving shutter that enables the deposition process to yield a coating position that is more consistently controlled. This can result in more accurately coated substrate elements and more deposition free substrate surfaces.

While various embodiments of the invention have been shown and described, it will be apparent to those skilled in the art that numerous alterations may be made without departing from the inventive concepts presented herein. Thus, the invention is not to be limited except in accordance with the following claims and their equivalents.

What is claimed is:

1. A method for depositing a material onto a plurality of features located on a surface of a substrate, comprising:
   evaporating the material to create an evaporant stream;
   positioning the substrate so that the evaporant stream strikes the plurality of features over a range of exposure angles between the evaporant stream and the substrate;
   moving the substrate to vary the range of exposure angles over which the evaporant stream strikes the plurality of features; and
   moving one or more shutters into the evaporant stream to block any part of the evaporant stream that has an exposure angle greater than a critical exposure angle.

2. The method of claim 1, wherein the moving of the substrate occurs continuously with the moving of one or more shutters.

3. The method of claim 1, wherein the moving of the substrate occurs sequentially with the moving of one or more shutters.

4. The method of claim 1, wherein the moving of the substrate occurs intermittently with the moving of one or more shutters.

5. The method of claim 1, wherein the critical exposure angle is an exposure angle at which the evaporant stream contacts the surface of the substrate.

6. The method of claim 1, wherein each feature comprises:
   a top surface that is substantially parallel to the surface of the substrate; and
   at least one side surface that is substantially perpendicular to the surface of the substrate.

7. The method of claim 6, wherein the positioning of the substrate causes the material to deposit onto one or more of the top surfaces.

8. The method of claim 6, wherein the positioning of the substrate causes the material to deposit onto one or more of the side surfaces.

9. The method of claim 6, wherein the moving of the substrate causes the material to deposit onto one or more of the side surfaces.

10. The method of claim 1, wherein each feature comprises:
    a top surface that is substantially non-parallel to the surface of the substrate; and
    at least one side surface that is substantially non-perpendicular to the surface of the substrate.

11. A method for depositing a material onto a plurality of features located on a surface of a substrate, comprising:
    evaporating the material to create an evaporant stream;
    positioning the substrate within the evaporant stream, thereby depositing the material onto portions of the plurality of features;
    moving the substrate, thereby depositing the material onto further portions of the plurality of features; and
    moving one or more shutters into the evaporant stream to block any part of the evaporant stream that will contact the surface of the substrate.

12. The method of claim 11, wherein the moving of the substrate occurs continuously with the moving of one or more shutters.

13. The method of claim 11, wherein the moving of the substrate occurs sequentially with the moving of one or more shutters.

14. The method of claim 11, wherein the moving of the substrate occurs intermittently with the moving of one or more shutters.

15. The method of claim 11, wherein each feature comprises:
    a top surface that is substantially parallel to the surface of the substrate; and
    at least one side surface that is substantially perpendicular to the surface of the substrate.

16. The method of claim 15, wherein the positioning of the substrate causes the material to deposit onto one or more of the top surfaces.

17. The method of claim 15, wherein the positioning of the substrate causes the material to deposit onto one or more of the side surfaces.

18. The method of claim 15, wherein the moving of the substrate causes the material to deposit onto one or more of the side surfaces.

19. The method of claim 11, wherein each feature comprises:
    a top surface that is substantially non-parallel to the surface of the substrate; and
    at least one side surface that is substantially non-perpendicular to the surface of the substrate.

* * * * *